United States Patent [19]
Whipple, III

[11] Patent Number: 5,594,333
[45] Date of Patent: *Jan. 14, 1997

[54] ZERO CURRENT SENSOR

[75] Inventor: Walter Whipple, III, Amsterdam, N.Y.

[73] Assignee: General Electric Company, Schenectady, N.Y.

[*] Notice: The term of this patent shall not extend beyond the expiration date of Pat. No. 5,319,304.

[21] Appl. No.: 600,324

[22] Filed: Feb. 13, 1996

Related U.S. Application Data

[60] Continuation of Ser. No. 208,760, Mar. 9, 1994, abandoned, which is a division of Ser. No. 132,772, Oct. 6, 1993, Pat. No. 5,319,304, which is a continuation of Ser. No. 877,305, May 1, 1992, abandoned.

[51] Int. Cl.$^6$ .................................................. G01R 27/00
[52] U.S. Cl. .......................................... 324/142; 324/119
[58] Field of Search .......................... 324/133, 79, 110, 324/74, 119, 772, 158.1, 73.1, 142, 107, 83 R, 76.1; 340/660, 658; 329/345; 371/15.1; 364/550.01

[56] References Cited

U.S. PATENT DOCUMENTS

| | | | |
|---|---|---|---|
| 2,895,106 | 7/1959 | Taunt | 324/767 |
| 3,560,763 | 2/1971 | Downey | 307/354 |
| 3,622,882 | 11/1971 | Gardner | 324/158 MG |
| 3,777,263 | 12/1973 | Perron et al. | 324/103 P |
| 3,999,087 | 12/1976 | Compton | 324/107 |
| 4,127,888 | 11/1978 | Epstein | 324/107 |
| 4,313,146 | 1/1982 | Lee | 324/107 |
| 4,636,720 | 1/1987 | Farr | 324/83 R |
| 4,888,701 | 12/1989 | Wakasugi et al. | 324/83 R |
| 4,901,005 | 2/1990 | Shin et al. | 324/107 |
| 5,001,364 | 3/1991 | Petrie et al. | 307/354 |
| 5,081,412 | 1/1992 | Thabit | 324/133 |

FOREIGN PATENT DOCUMENTS

| | | | |
|---|---|---|---|
| 0206269 | 8/1989 | Japan | 324/107 |
| 2149128 | 6/1985 | United Kingdom | 324/107 |

OTHER PUBLICATIONS

John Markus, Modern Electronic Circuits Reference Manual, p. 1165, (1980)(no month).
John Markus, Modern Electronic Circuits Reference Manual, p. 1164, (1980).(no month).

*Primary Examiner*—Vinh P. Nguyen
*Attorney, Agent, or Firm*—Marvin Snyder

[57] ABSTRACT

A load measuring device includes a sensor for detecting power consumption surges by detecting a zero voltage point in the alternating voltage of an electrical apparatus, detecting the zero current point in the alternating current of the apparatus least remote in time from the detected zero voltage point, and measuring the interval between the two zero points. The zero-current point is detected by a current sensor which comprises a first rectifier coupled in series with the apparatus, a second rectifier coupled in parallel opposition with the first rectifier, and a voltage sensor coupled in parallel with both rectifiers.

8 Claims, 12 Drawing Sheets

ZERO CURRENT SENSOR

This application is a Continuation of application Ser. No. 08/208,760 filed Mar. 9, 1994, now abandoned, which is a division of application Ser. No. 08/132,772, filed Oct. 6, 1993, now U.S. Pat. No. 5,319,304 issued Jun. 7, 1994, which is a continuation of application Ser. No. 07/877,305, filed May 1, 1992, now abandoned.

RELATED APPLICATION

This application is related to patent application Ser. No. 07/877,309, entitled "Fluid-Handling Machine Incorporating a Closed Loop System for Controlling Machine Load," by Whipple, III et el., filed May 1, 1992 (now U.S. Pat. No. 5,330,580), U.S. patent application Ser. No. 07/877,310, entitled "Sensor Holder for a Machine for Cleansing Articles" by Dausch et el., filed May 1, 1992, now U.S. Pat. No. 5,259,219, issued Nov. 9, 1993. patent application Ser. No. 07/877,303 (RD-21,521), entitled "Machine for Cleansing Articles," by Molnar et el., filed May 1, 1992 (now U.S. Pat. No. 5,291,626) patent application Ser. No. 07/877,300, entitled "Fluid-Handling Machine Incorporating a Closed Loop System for Controlling Liquid Load," by Dausch et el., filed May 1, 1992, now abandoned in favor of continuation application Ser. No. 08/126,139, filed Sept. 23, 1993 (now U.S. Pat. No. 5,313,964) and divisional application Ser. No. 08/185,087, filed Jan. 24, 1994 (now U.S. Pat. No. 5,408, 716). patent application Ser. No. 07/877,301, entitled "A Fuzzy Logic Control Method for Reducing Water Consumption in a Machine for Washing Articles," by Badami et al., (now U.S. Pat. No. 5,284,523, issued Feb. 8, 1994) and patent application Ser. No. 07/877,302, entitled "A Fuzzy Logic Control Method for Reducing Energy Consumption in a Machine for Washing Articles," by Dausch et al., filed May 1, 1992, now abandoned. The aforesaid patent applications are assigned to the assignee of the present invention and herein incorporated by reference.

FIELD OF THE INVENTION

The invention relates to an apparatus or device for monitoring load, such as liquid load.

BACKGROUND OF THE INVENTION

Reducing the amount of energy consumption by a machine for cleansing articles, such as a clothes washer, is a significant problem, in part because of increasing worldwide energy demand. In such a machine, the amount of energy consumed is primarily determined by the amount of energy needed to heat the liquid, such as water, used to cleanse the articles. Thus, decreased liquid consumption for such machines may result in a significant improvement in energy efficiency.

Appliances for cleansing articles, such as clothes washers, typically receive liquid for a predetermined duration through a conduit connected to the machine. A wash cycle for a machine for cleansing articles may comprise providing substantially particle-free liquid to the machine, circulating or distributing the liquid during the wash cycle, and draining or flushing the liquid from the machine after being used to wash the articles. Typically, a machine user has limited control over the amount of liquid provided for a wash cycle, such as by selection from a few predetermined options. Such a machine does not use liquid efficiently because variations in liquid pressure or degradation in machine components generally require providing liquid for an excessive duration to ensure more than a sufficient amount for a wash cycle.

Devices for measuring the amount of liquid, such as water, provided to a machine for cleansing articles include flowmeters that measure the water flow rate and water level sensors that detect the static air pressure in an air cavity in the sensor. However, such devices may be difficult or non-economic to implement, may be unreliable, may degrade over time, and may not provide robust measurements relative to the machines incorporating them.

A need thus exists for a device for monitoring load, such as liquid load, that is simple and economic to produce, that is reliable, that does not degrade over time, and that provides robust measurements relative to the machines incorporating them.

SUMMARY OF THE INVENTION

One object of the invention is to provide a load measuring device that is simple and economic to produce.

Another object is to provide a rugged load measuring device comprising solid state electronic components.

Still another object is to provide a load measuring device for machines for cleansing articles that is more reliable than those currently available.

An additional object is to provide a load measuring device that provides robust load measurements relative to a machine for cleansing articles incorporating the device.

One more object is to provide a load measuring device that detects zero current points without the need of an additional power supply.

In accordance with the invention, a load measuring device for a machine includes a sensor for detecting power consumption surges by measuring the magnitude of the difference in phase angle between the alternating current and the alternating voltage in an electrical apparatus.

BRIEF DESCRIPTION OF THE DRAWINGS

The subject matter regarded as the invention is particularly pointed out and distinctly claimed in the concluding portion of the specification. The invention, however, both as to organization and method of operation, together with further objects and advantages thereof, may best be understood by reference to the following detailed description when read with the accompanying drawings in which:

DETAILED DESCRIPTION OF THE INVENTION

Figure 1:
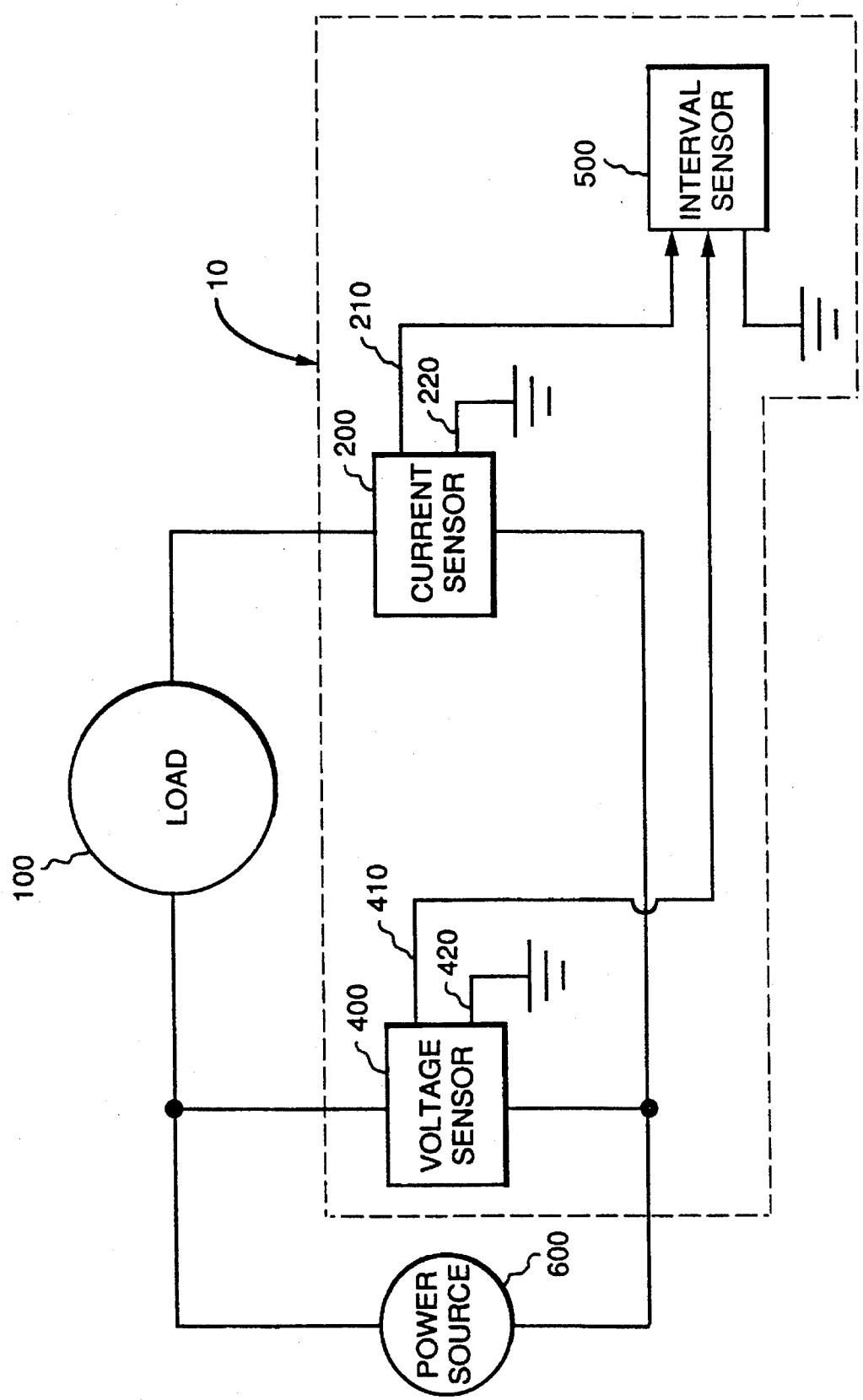
FIG. 1 is a schematic diagram of a load measuring device in accordance with the invention.

FIG. 1 illustrates a device 10 for monitoring machine load, such as motor load or liquid load, as described in the aforesaid patent applications Ser. Nos. 07/877,304 (now U.S. Pat. No. 5,330,580) and 07/877,300 abandoned in favor of continuation application Ser. No. 08/126,139 (now U.S. Pat. No. 5,313,964) and divisional application Ser. No. 08/185,087 (now U.S. Pat. No. 5,408,716). In FIG. 1, device 10 is coupled to a load 100, which may comprise any type of electrical apparatus, such as a motor. Load 100 is coupled to an AC power source 600.

Device 10 comprises a sensor for detecting power consumption surges in load 100. In the context of this invention, a power consumption surge refers to substantial changes in power consumption when load, such as machine load or liquid load, is changing. The sensor for detecting power consumption surges comprises a device for measuring the magnitude of the difference in phase angle between the alternating current of load 100 and the alternating voltage of load 100.

To measure the magnitude of the difference in phase angle, device 10 comprises a sensor 200 for detecting at least one zero current point in the alternating current of load 100. Sensor 200 is shown with a signal output 210, and an output 220 coupled to ground. Sensor 200 is shown coupled in series with load 100.

Device 10 further comprises a sensor 400 for detecting the zero voltage point in the alternating voltage of load 100 that is least remote in time from the zero current point detected by sensor 200. In FIG. 1, sensor 400 is shown with a signal output 410, and an output 420 coupled to ground. Device 10 also includes a component 500, coupled to sensors 200 and 400, for measuring the duration between the zero current point detected by sensor 200 and the zero voltage point detected by sensor 400, although alternative embodiments of device 10 may exclude component 500. Sensor 400 is shown coupled in parallel with the series combination of load 100 and sensor 200.

Figures 10A, 10B, 10C:
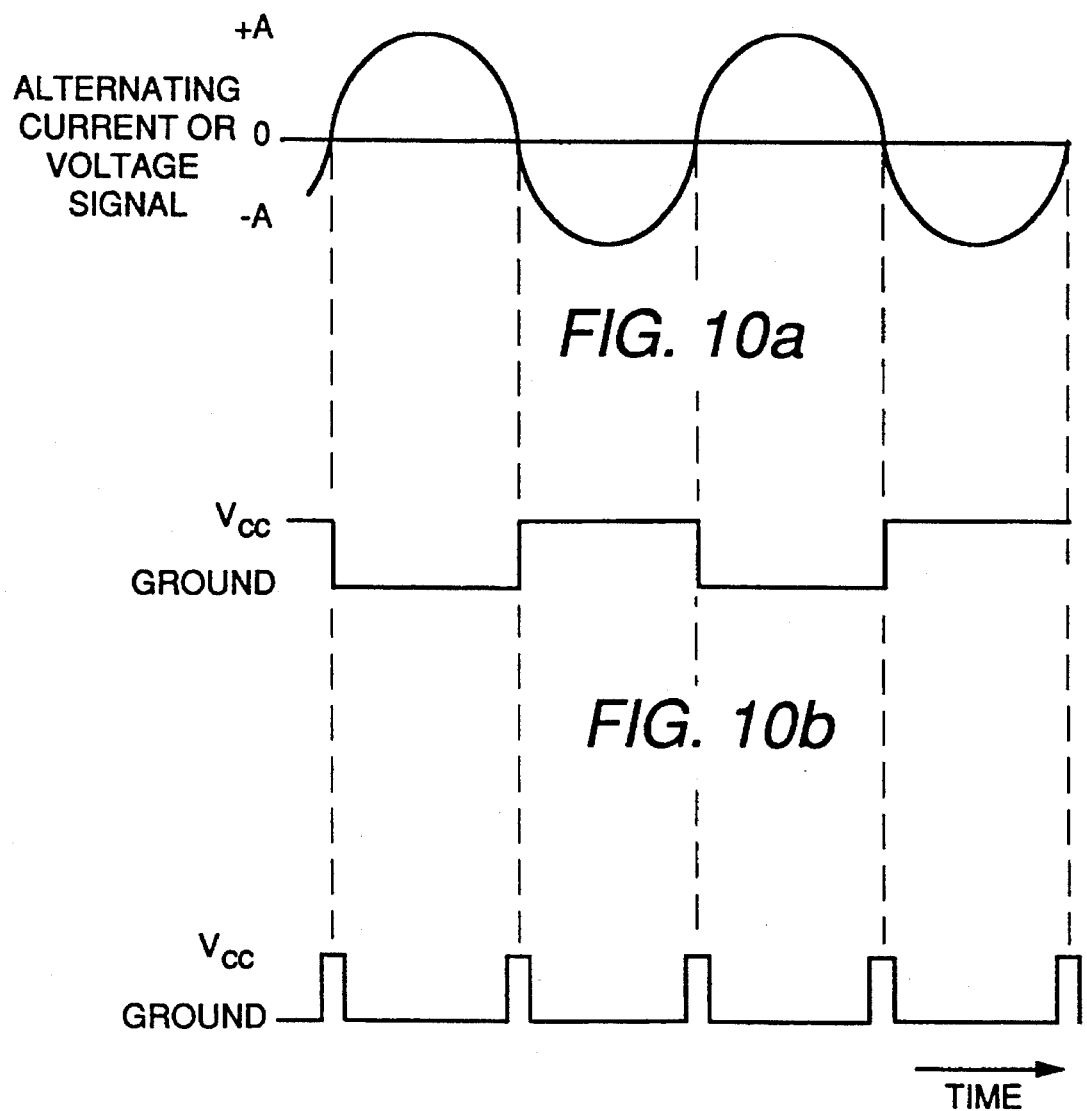
FIG. 10(a) is a plot of an alternating voltage or current in an electrical apparatus.
FIGS. 10(b) and (c), respectively, show waveforms of signals that may be produced by a sensor for detecting a zero voltage or current point.

In operation, power source 600 provides an alternating voltage to load 100. In the description of the operation of device 10 provided hereinafter, it is assumed the device has reached steady-state operation. Sensor 400 senses at least one zero voltage point of the alternating voltage of load 100, and provides a signal at output 410 which may take any one of a number of forms, such as, for example, a square wave voltage varying between two voltage levels, such as a voltage level Vcc and ground, with transitioning occurring when sensor 400 senses a zero voltage point. Alternatively, the signal provided at output 410 may take the form of a series of voltage spikes, each spike occurring when sensor 400 senses a zero voltage point. These respective signals are illustrated in FIGS. 10(b) and 10(c), on a common time base with a corresponding alternating voltage signal illustrated in FIG. 10(a). The particular choice of signal at output 410 will depend on the particular configuration of sensor 400.

Figure 1A:
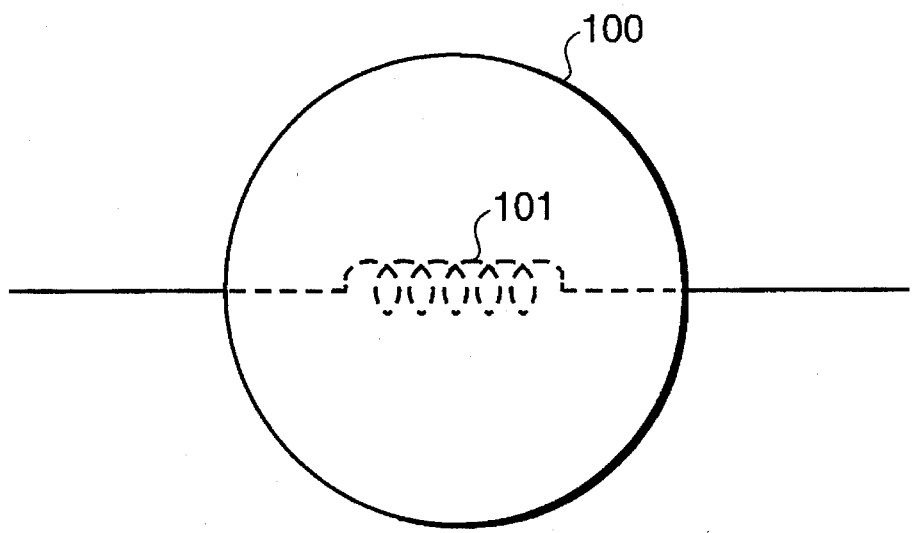
FIGS. 1a and 1b illustrate load 100 of FIG. 1 as being either an inductive reactance (FIG. 1a) or a capacitive reactance (FIG. 1b), respectively.
Figure 1B:
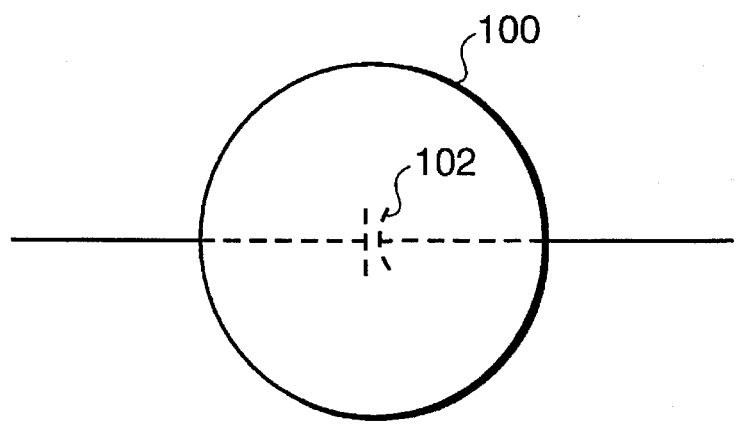

Alternating voltage from power source 600 is provided to load 100 and results in an alternating current through load 100. Depending on the particular load, the phase angle of the alternating current in load 100 may either lead or lag the alternating voltage of load 100. The load may comprise an AC motor, or it may be in the nature of an inductive reactance, as shown schematically in FIG. 1a, or capacitive reactance as shown schematically in FIG. 1b. The alternating current of load 100 may also be substantially in phase with the voltage, this possibility occurring in the case of a resistive load. In situations where load 100 comprises either an inductive load or an electric motor, the alternating current through load 100 lags the alternating voltage. Thus, some time period or duration after sensor 400 has sensed a zero voltage point in the alternating voltage of load 100, sensor 200 senses a corresponding zero current point in the alternating current of load 100.

Sensor 200 provides a signal, such as a voltage signal, at output 210 corresponding to the sensed zero current point in the alternating current of load 100. Depending upon the particular embodiment of sensor 200 the signal at output 210 may take any one of a number of forms. For example, as illustrated in FIGS. 10(b) and 10(c), a voltage signal such as shown in FIG. 10(b) and provided at output 210, may take the form of a square wave transitioning between a voltage amplitude Vcc and ground at each zero current point, or it may take the form of a series of voltage spikes, each occurring at a zero current point, as shown in FIG. 10(c).

Component 500 may also take a number of forms. In situations where outputs 410 and 210, respectively, provide voltage spikes at each zero voltage point and zero current point, respectively, component 500 may comprise a microprocessor, microcontroller, application specific integrated circuit (ASIC), digital signal processor (DSP), or other processor, that begins counting clock pulses of an internal clock upon receiving a voltage spike signal from output 410 to indicate a zero voltage point and ceases counting clock pulses upon receiving a voltage spike from output 210 to indicate a zero current point. The number of clock pulses counted by the processor during that period provides a measurement of the duration between the two voltage spikes provided at outputs 410 and 210, respectively, and, hence, the difference in phase angle between the alternating voltage of load 100 and the alternating current of load 100. Alternatively, component 500 may comprise an electronic device, such as a conventional flip-flop, to measure the duration between voltage spikes. In the embodiment where component 500 comprises a microprocessor or other processor, the processor may further include a computer program for computing the difference in phase angle corresponding to the number of clock pulses. Likewise, the processor may further include programming to further process the phase angle difference to detect power consumption surges in load 100.

In an alternative embodiment, device 10 illustrated in FIG. 1 may comprise sensors 200 and 400 in which the signals provided at outputs 410 and 210 respectively comprise voltage square wave signals, as previously described. In this embodiment, component 500 may comprise a microprocessor or other processor. Alternatively, component 500 may comprise a conventional flip-flop, an AND function gate, or other digital electronic component, to provide a digital output signal for the duration in which the voltage signals provided at outputs 410 and 210 are both positive square waves. For example, depending upon the particular embodiments of sensors 400 and 200, sensor 400 may, as illustrated in FIG. 10(b), provide a voltage square wave transitioning to ground at a first zero voltage point in which the alternating voltage of load 100 is increasing and transitioning to a positive voltage at a succeeding zero voltage point in which the alternating voltage of load 100 is decreasing. Likewise, sensor 200 may provide a voltage signal at output 210 comprising a voltage square wave transitioning to ground at the zero current point in which the alternating current of load 100 is increasing and transitioning to a positive voltage at a succeeding zero current point in which the alternating current of load 100 is decreasing. As indicated in FIG. 1, both of these voltage square wave signals may then be provided to component 500. In the embodiment in which component 500 comprises an AND gate, the output of the AND gate may provide a positive voltage during the time period in which the signals provided at outputs 410 and 210 each are respectively of positive voltage. In such an embodiment, component 500 may further comprise an analog integration circuit, such as a conventional low-pass filter, for integrating of the output signal of the AND gate to provide a measurement of the duration between the zero voltage point and the zero current point previously described.

Figure 2:
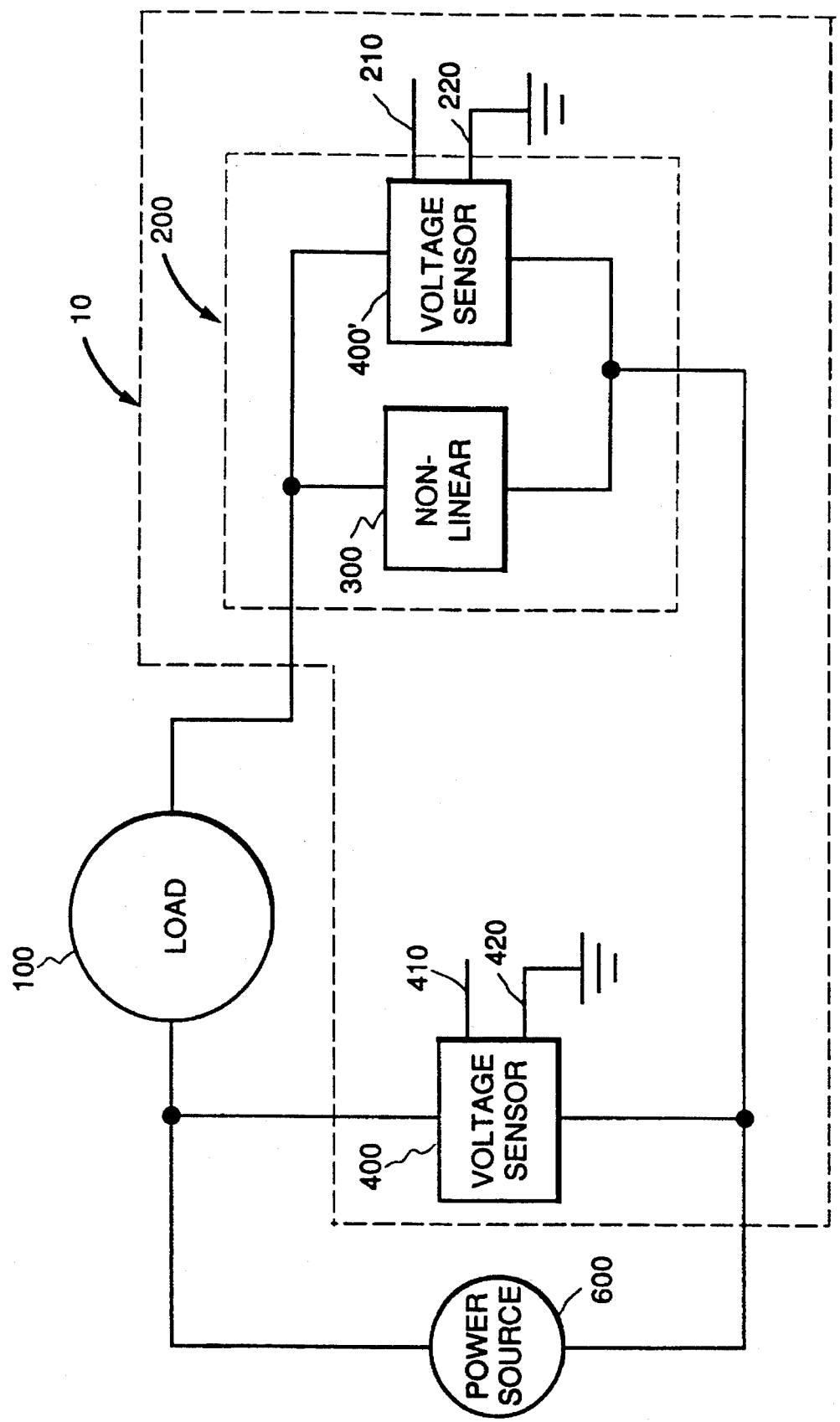
FIG. 2 is a schematic diagram of an alternative embodiment of a load measuring device in accordance with the invention.

FIG. 2 shows an alternative embodiment of device 10 coupled to load 100. Sensor 200 is illustrated as comprising a component 400', which may be substantially identical to sensor 400, and a non-linear component 300 for transforming component 400' from a sensor for detecting a zero voltage point to a sensor for detecting a zero current point. Component 400', which need not be substantially identical to sensor 400, may comprise any one of a number of sensors for detecting a zero voltage point in an alternating voltage. As illustrated, non-linear component 300 is shown coupled in series with load 100 and coupled in parallel with component 400'.

Figure 3:
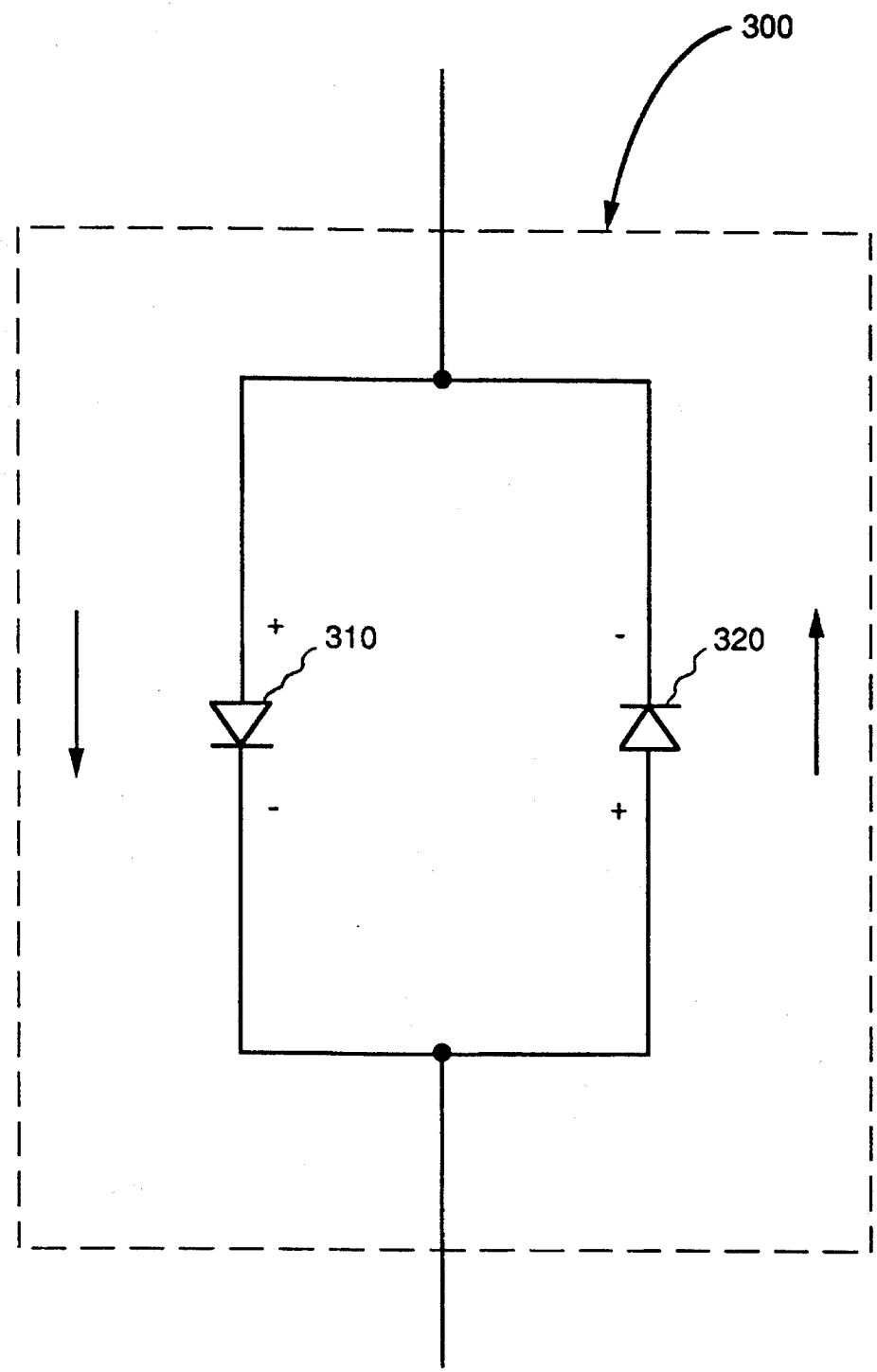
FIGS. 3–5 are schematic diagrams of alternative embodiments of a sensor for detecting at least one zero current point of an alternating current in an apparatus, for incorporation in a load measuring device in accordance with the invention.

A number of alternative embodiments exist for non-linear component 300. One embodiment, illustrated in FIG. 3, shows non-linear component 300 comprising a first rectifier element 310 having a first direction of conduction and a second rectifier element 320 having a second, opposite direction of conduction. The direction of conduction is indicated in FIG. 3 by arrows. Rectifier element 310 is coupled in series with load 100 (FIG. 2) and rectifier element 320 is coupled in parallel with rectifier element 310 and in series with load 100. In the context of this invention, rectifier element refers to a device which permits current flow substantially in only one direction.

Any one of a number of components would constitute a satisfactory electrical rectifier element, such as a silicon diode, a gallium arsenide diode, a zener diode, schottky diode, and others. It will be appreciated that when rectifier elements 310 and 320 comprise diodes, each respectively includes a positive voltage bias in the respective direction of conduction. A silicon diode, for example, typically provides a bias in the range of from approximately 0.6 to approximately 0.7 volts in the direction of conduction of the diode.

The embodiment of device 10 in which sensor 200 is illustrated in FIG. 2 and non-linear component 300 is illustrated in FIG. 3 operates in the following manner. Power source 600 provides an alternating voltage to load 100, such as an electric motor or an inductor in this example. Sensor 400 senses a zero voltage point in the alternating voltage. An alternating current through load 100 and provided to sensor 200 lags the alternating voltage of load 100. If the zero voltage point sensed by sensor 400 in the alternating voltage of load 100 is an increasing voltage, rectifier element 310 in non-linear component 300 conducts current in the first direction of conduction, and a positive voltage bias on rectifier element 310 is applied across component 400'. In response, component 400' provides a signal, such as a voltage signal, at output 210 substantially similar to the signal provided at output 410 by sensor 400, but delayed in time by the phase lag of the alternating current of load 100 from its alternating voltage. As illustrated in FIG. 1, the signals at outputs 410 and 210 are respectively provided to component 500, which measures the duration between the signals. In the configuration illustrated in FIG. 2, the alternating voltage of load 100 begins to decrease after reaching a peak voltage and reaches another zero voltage point. Sensor 400 senses the zero voltage point, and provides a signal at output 410. After the corresponding lagging zero current point is reached by load 100, current flows in the second direction of conduction and rectifier element 320 provides a positive voltage bias so that component 400' senses this voltage and provides a signal at output 210.

Figure 4:
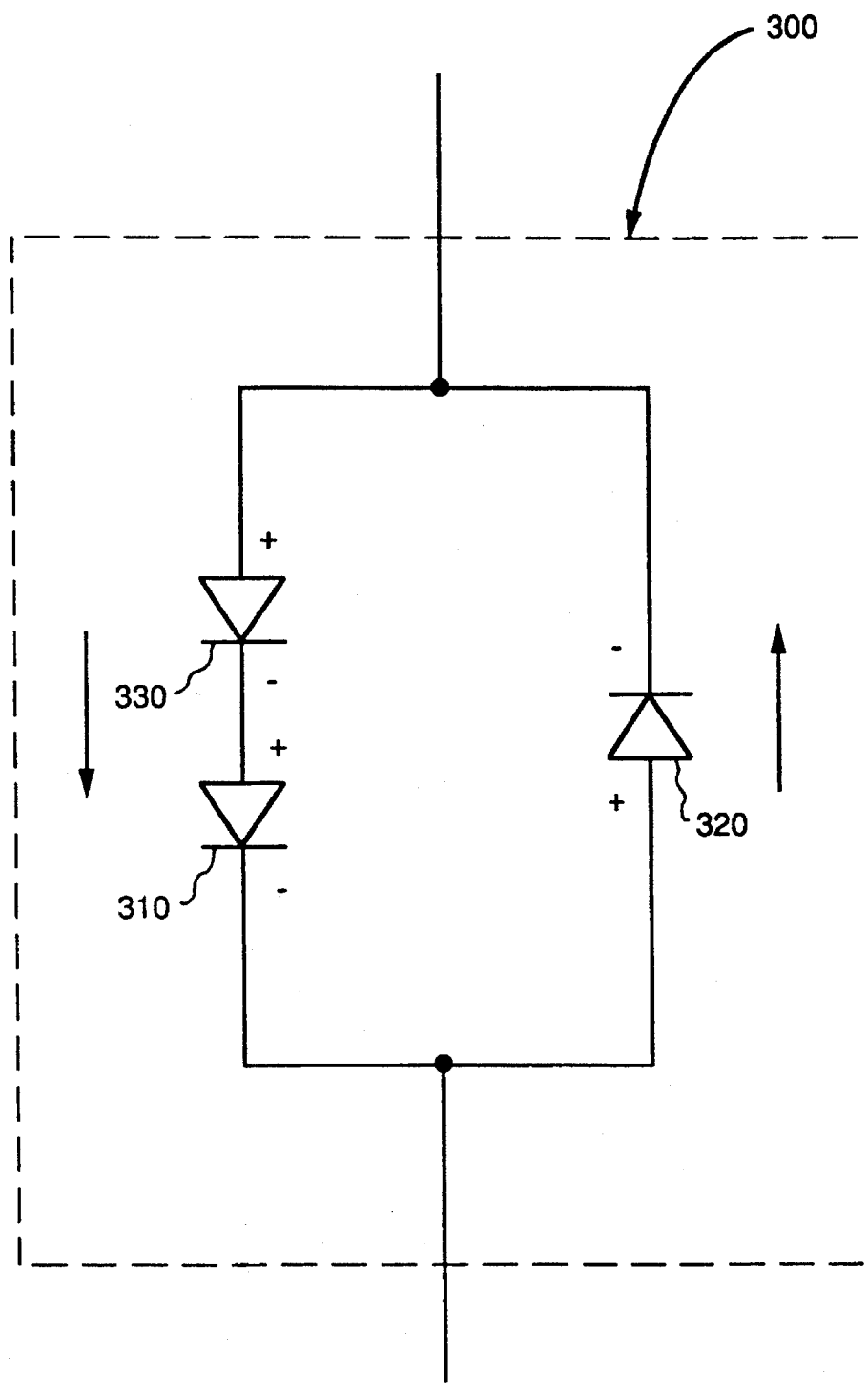

FIG. 4, which illustrates an alternative embodiment of non-linear component 300 of FIG. 2, shows rectifier elements 310 and 320 as silicon diodes and further includes a third silicon diode 330 in series with rectifier element 310 having the same direction of conduction as rectifier element 310 and coupled in parallel with rectifier element 320. The embodiment of the invention illustrated in FIG. 4 is not restricted to silicon diodes. Any electrical rectifier element would prove satisfactory performance, although it will depend, in part, upon the other components of device 10 and the particular use of device 10. Silicon diodes 310 and 330 coupled together in series provide in the range of from approximately 1.2 to approximately 1.4 volts of bias in the first direction of conduction while silicon diode 320 provides in the range of from approximately 0.6 to approximately 0.7 volts of bias in the second direction of conduction.

Figure 5:
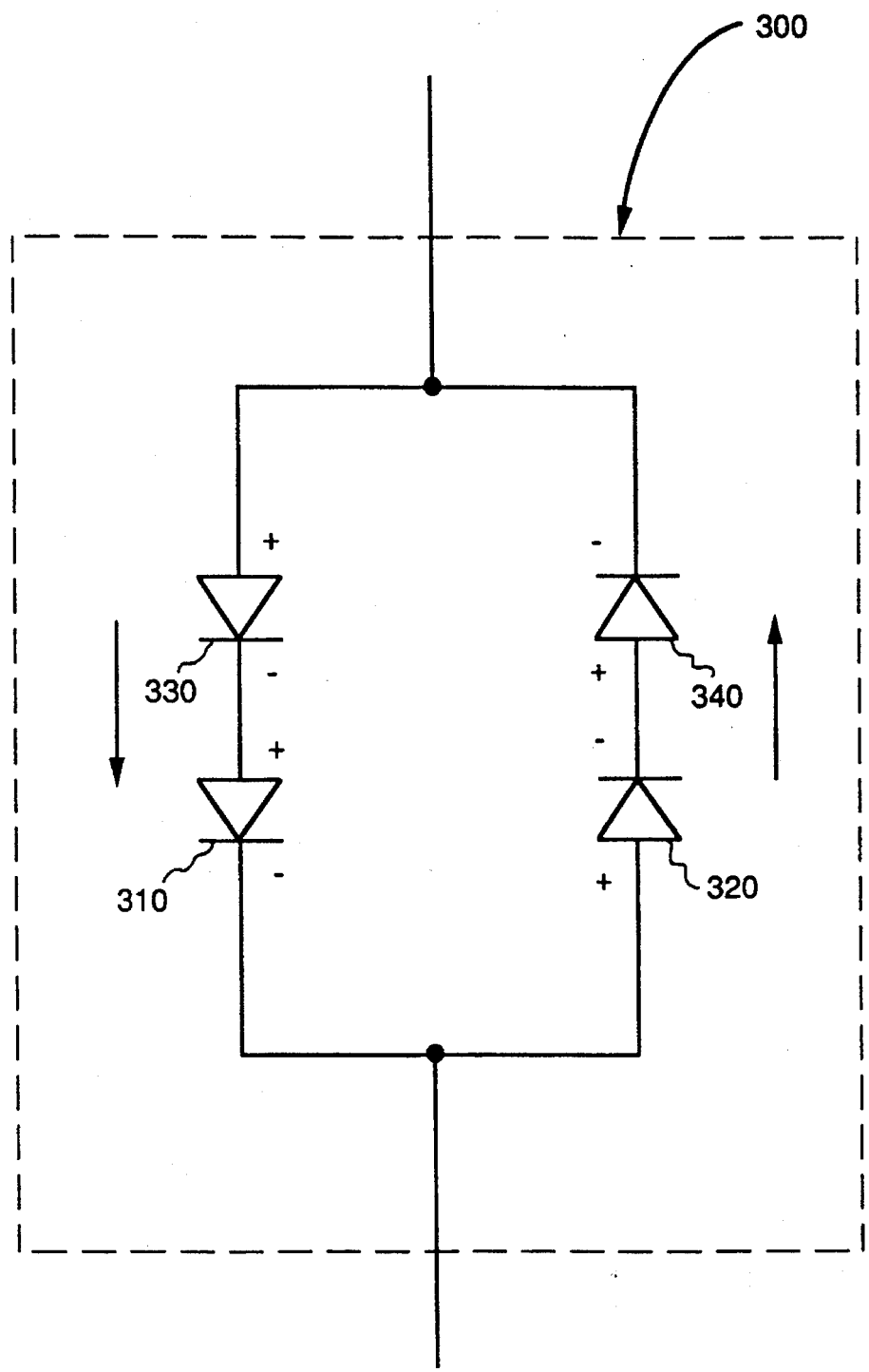

Yet another embodiment of non-linear component 300, as shown in FIG. 5, includes the silicon diodes of FIG. 4 and a fourth silicon diode coupled in series with silicon diode 320 and in parallel with silicon diodes 310 and 330. Fourth silicon diode 340 has the same direction of conduction as silicon diode 320. Again, the embodiment shown in FIG. 5 is not restricted to silicon diodes.

Figure 6:
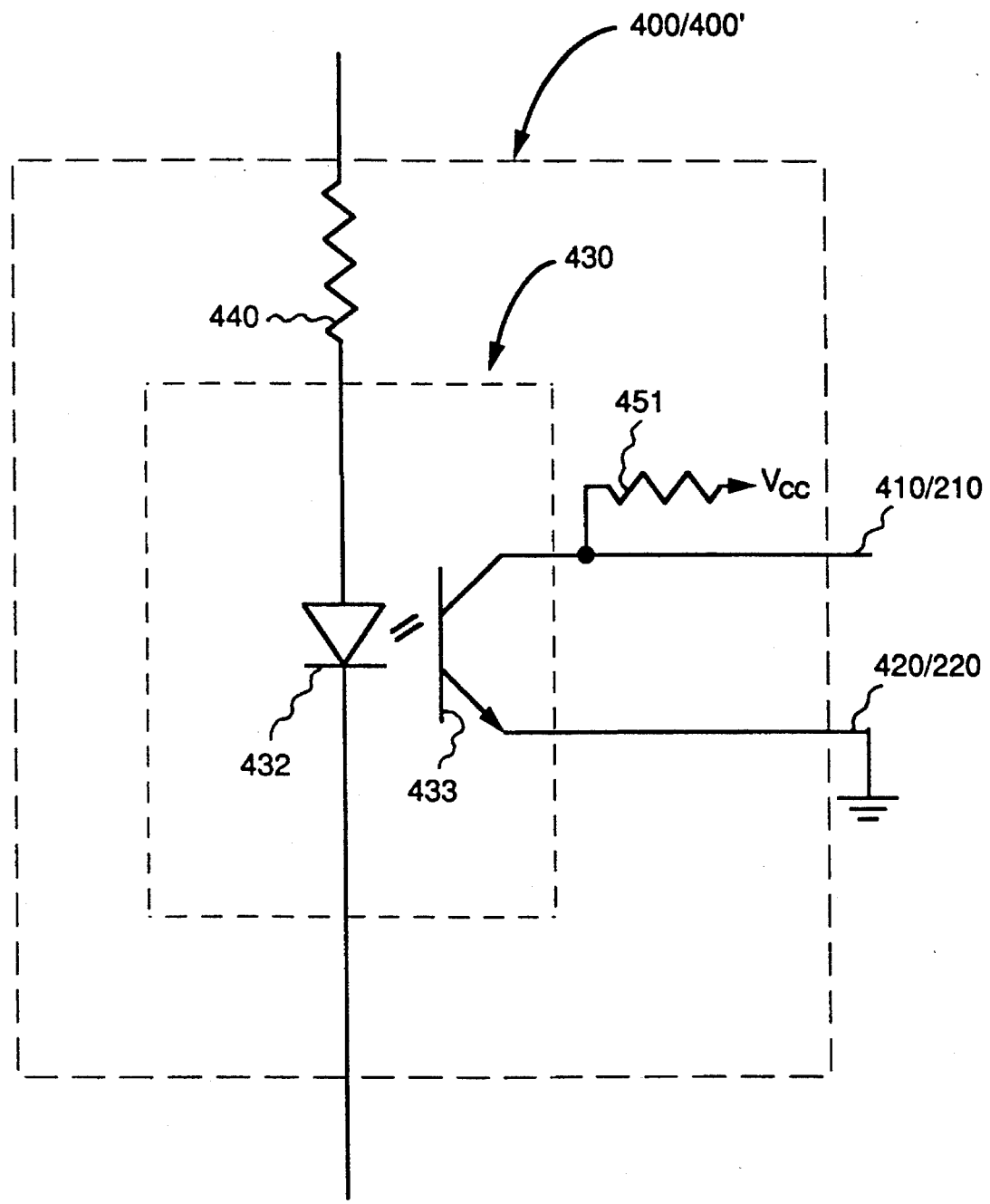
FIGS. 6–9 are schematic diagrams of alternative embodiments of a sensor for detecting a zero voltage point of an alternating voltage in an electrical apparatus.

In the embodiment of non-linear component 300 illustrated in FIG. 4, the bias provided by coupling silicon diodes 310 and 330 in series is in the range of from approximately 1.2 to approximately 1.4 volts. Appropriate use of the embodiment illustrated in FIG. 4 of non-linear component 300 depends, in part, upon the embodiment of component 400' (FIG. 2). For example, component 400' may comprise an opto-isolator device 430, such as a light emitting diode (LED) 432 coupled to a photo transistor 433 as illustrated in FIG. 6. FIG. 6 further includes a resistor 440 for adjustment of the current through LED 432, and a resistor 451 coupling the collector of transistor 433 to voltage supply Vcc. In the embodiment of component 300 illustrated in FIG. 4, silicon diodes 310 and 330 coupled in series provide a sufficient positive voltage bias to activate the opto-isolator device of FIG. 6 when the alternating current of load 100 conducts in the first direction of conduction. Likewise, sensor 400 of FIG. 2 may similarly comprise an opto-isolator device substantially similar to the opto-isolator device of component 400'. When the embodiment of the invention illustrated in FIG. 2 includes the embodiment of sensor 400 and component 400' illustrated in FIG. 6, device 10 has the additional advantage of providing electrical isolation from power source 600. Such an embodiment may provide advantages in any one of a number of machines or apparatus', such as where power source 600 includes a power station and device 10 is incorporated into a household appliance.

Figure 7:
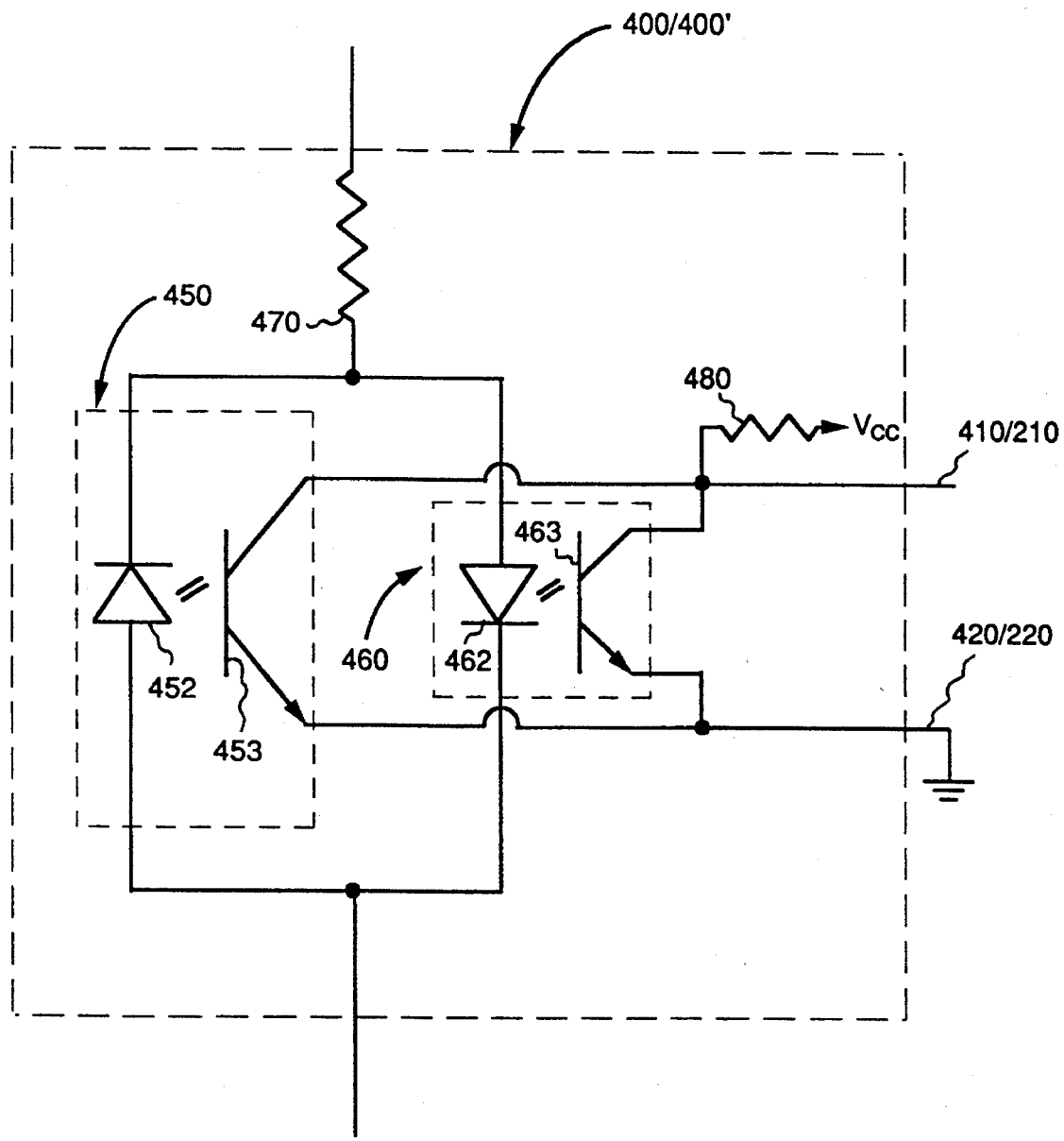

The embodiment of device 10 illustrated in FIG. 2, in which non-linear component 300 comprises the embodiment illustrated in FIG. 5, also operates so that a positive bias in the range of from approximately 1.2 to approximately 1.4 volts is provided by diodes 310 and 330 coupled in series when the alternating current of load 100 conducts current in the first direction of conduction. Likewise, diodes 320 and 340 coupled in series provide a positive bias in the range of from approximately 1.2 to approximately 1.4 volts when the alternating current of load 100 is conducted in the second direction of conduction. This embodiment may be used in combination with the embodiment of component 400' illustrated in FIG. 7. FIG. 7 illustrates component 400' as comprising an opto-isolator device 460 having a direction of conduction in the same direction as the first direction of conduction. Coupled in parallel with the first opto-isolator device 460 is a second opto-isolator device 450 having a direction of conduction opposite the first direction of conduction. Opto-isolator device 460 is coupled in parallel with opto-isolator device 450 and in series with load 100 (FIG. 2). The opto-isolator devices each comprise a LED coupled to the base of a photo transistor so that the conduction of current through the LED, such as diodes 452 and 462, results in the emission of light or radiation to the base of the photo transistor, such as transistors 453 and 463, respectively, to permit the conduction of current from the collector to the emitter of the particular photo transistor. The embodiment of component 400' illustrated in FIG. 7 further includes a resistor 470 in series with opto-isolator devices 460 and 450 and a resistor 480 coupling the collector of each photo transistor to a voltage source Vcc. The embodiment of device 10 in which non-linear component 300 comprises the embodiment illustrated in FIG. 5 and component 400 comprises the embodiment illustrated in FIG. 7 includes additional silicon diodes and opto-isolator devices in contrast with preceding embodiments to provide twice the number of measurements of phase angle difference per cycle of alternating voltage.

Figure 8:
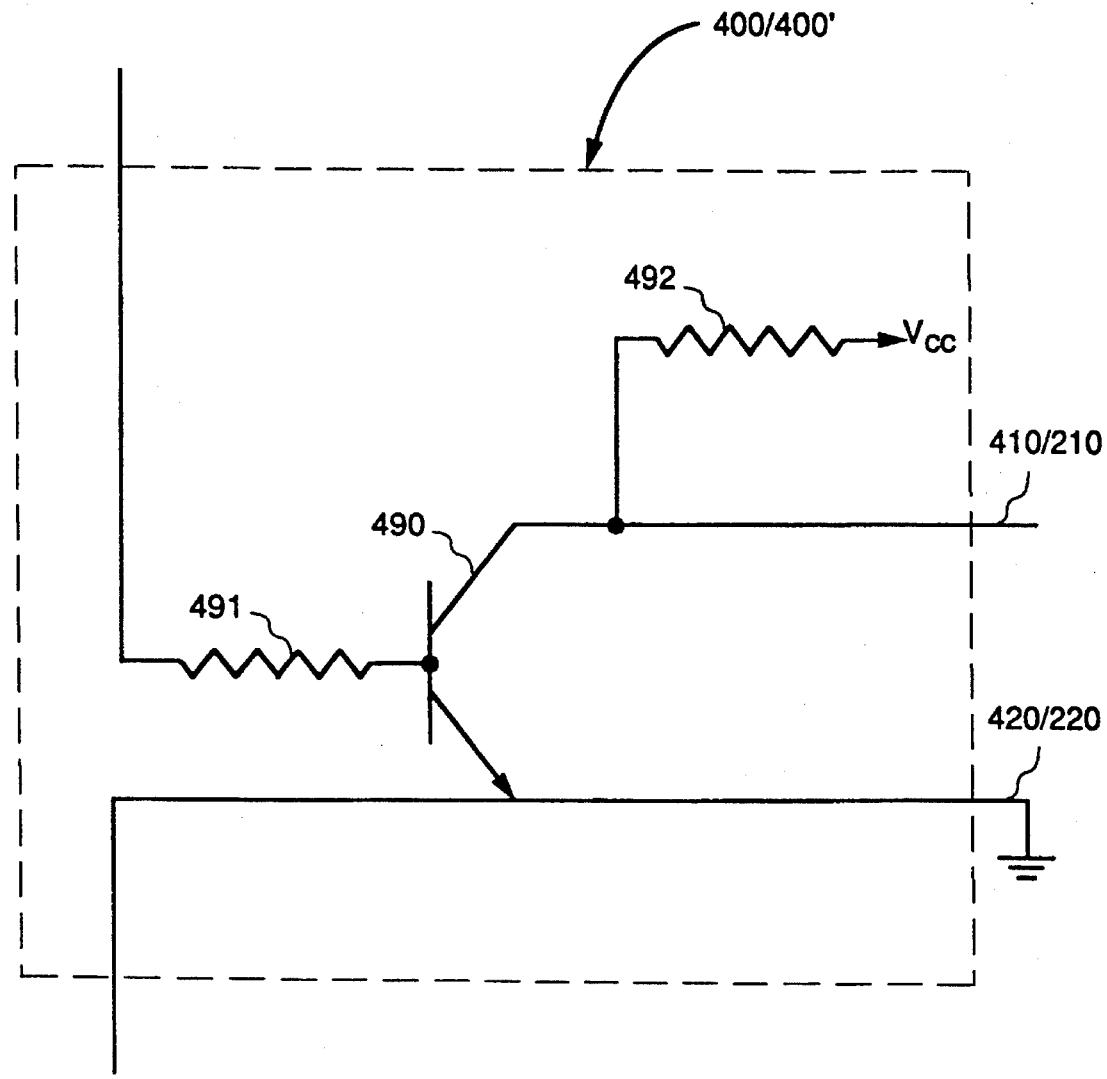
Figure 9:
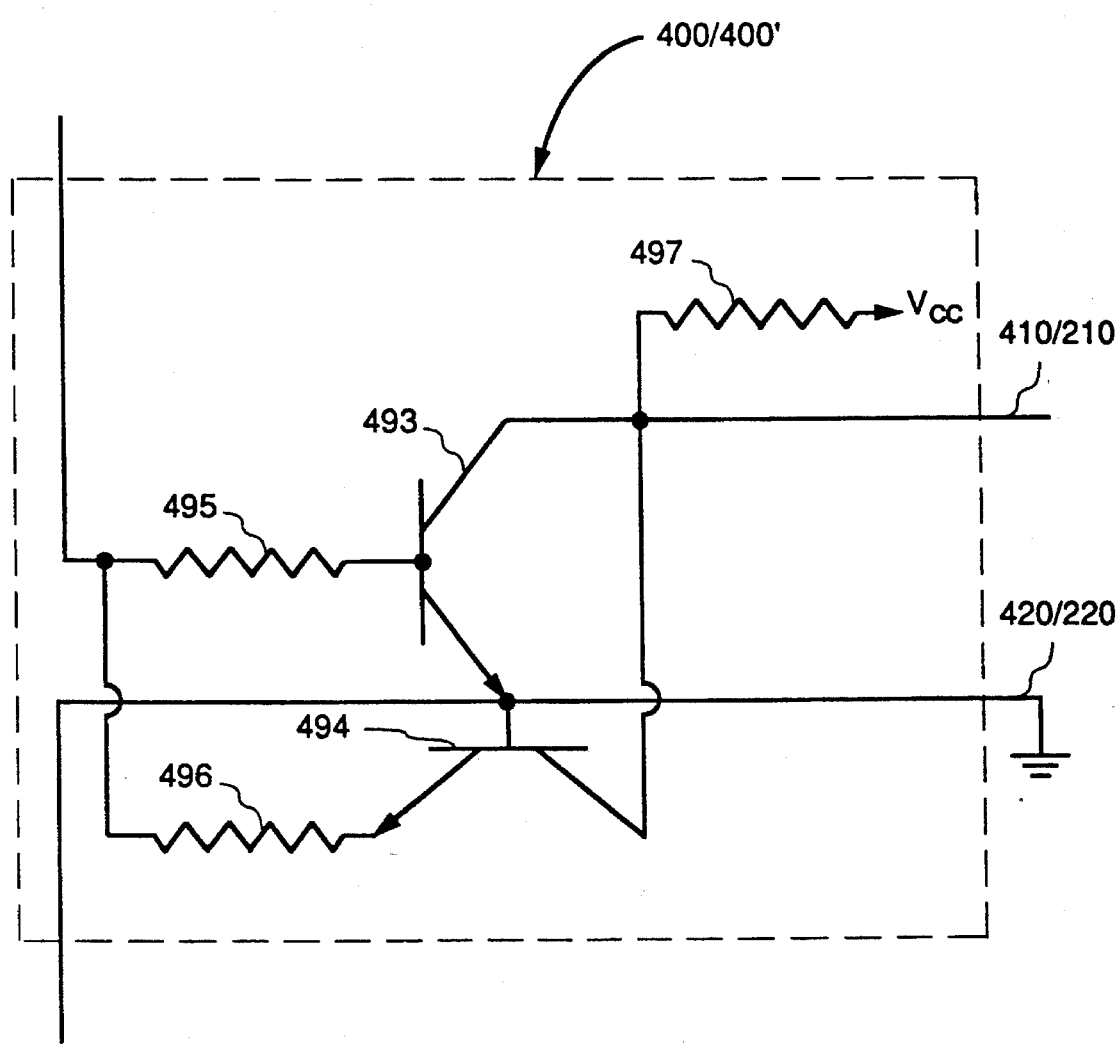

Two alternative embodiments of component 400' of FIG. 2 are illustrated in FIGS. 8 and 9, respectively. These embodiments also provide possible embodiments for sensor 400 of FIG. 2. The 10 embodiments illustrated in FIGS. 8 and 9 may be used with the embodiment of non-linear component 300 illustrated in FIG. 3. Transistor 490 in FIG. 8 functions in a similar fashion as opto-isolator device 430 in FIG. 6, although the transistor base is controlled electronically, rather than optically. Resistors 491 and 492 in FIG. 8 provide current adjustment. Likewise, transistors 493 and 494 in FIG. 9 function in a similar fashion as opto-isolator devices 450 and 460 in FIG. 7, although the transistor bases are controlled electronically, rather than optically. Resistors 495, 496, and 497 provide for the adjustment of current. An embodiment as illustrated in either of FIGS. 8 or 9 does not provide electrical isolation from power source 600 (in FIG. 2); nonetheless, they employ less components than the previous embodiments providing such isolation and are likely to prove more economic. It will further be appreciated that the embodiment illustrated in FIG. 9 provides twice the number of measurements of phase angle difference per cycle of alternating voltage as the embodiment illustrated in FIG. 8.

A device for monitoring load in accordance with the present invention provides several advantages. For example, to detect zero current points the invention does not require use of a transformer, comparator, operational amplifier, additional power supply, or any combination thereof. This saves additional materials and avoids complex circuitry, thus making the invention economic. In addition, a load monitoring device in accordance with the present invention provides fast transitions which may prove useful when used in conjunction with other digital electronic devices, such as to determine zero current points or phase angle differences. Finally, a load monitoring device in accordance with the present invention provides noise immunity because it relies in part upon current, rather than exclusively upon voltage, to determine load.

Device 10 illustrated in FIG. 1 may be used to detect power consumption surges. As illustrated in FIG. 1, load 100, such as an electrical apparatus, is energized by an alternating current with a first phase and an alternating voltage with a second phase. A method for detecting power consumption surges in load 100 comprises the step of detecting the magnitude of the difference between the first phase and the second phase.

Figure 11:
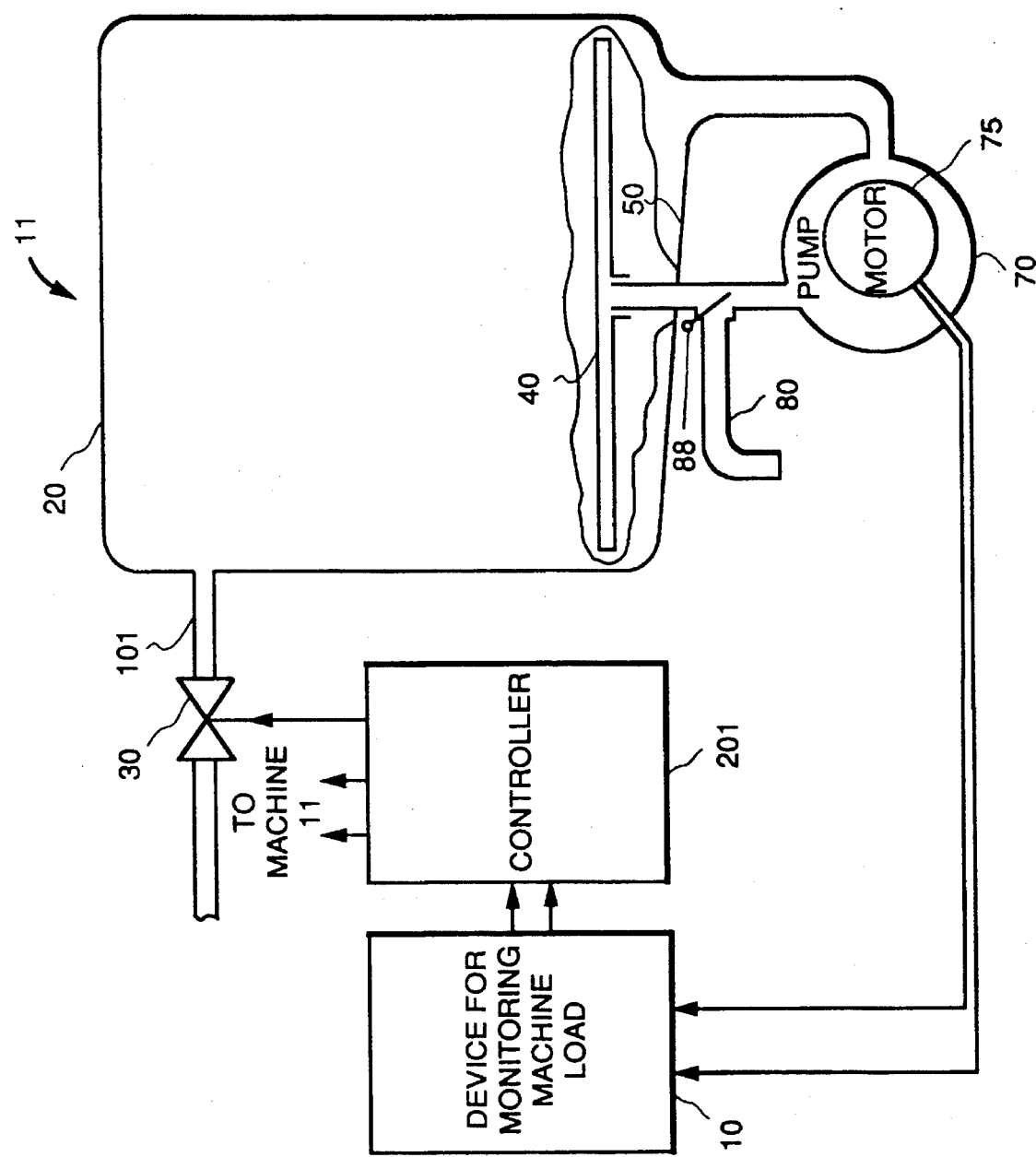
FIG. 11 is a schematic diagram of a fluid-handling machine incorporating a closed loop system for controlling machine load.

In situations where the alternating current of load 100 has a plurality of zero current points and the alternating voltage across load 100 has a plurality of zero voltage points, the step of detecting the magnitude of the difference between the first phase and the second phase comprises the steps of detecting at least one zero current point of the alternating current, detecting at least the zero voltage point least remote in time from the zero current point detected, and measuring the duration between the zero current point detected and the zero voltage point detected. FIG. 11 illustrates an embodiment of a fluid-handling machine incorporating a closed loop system for controlling machine load, such as disclosed and described in application Ser. No. 07/877,304 (now U.S. Pat. No. 5,330,580) in which an embodiment of a device for monitoring load, such as device 10, may be incorporated.

The specific configuration of machine 11 for cleansing articles depends in part on the type of machine, such as a dishwasher. For example, as illustrated in FIG. 11, machine 11 includes: a subsystem to distribute or circulate liquid, which may include a sump 50 of frame 20, a spray arm 40 rotatably connected to, and in liquid communication with, a pump 70, and the pump; a subsystem to provide substantially particle-free liquid, which may include conduit 101 connected to frame 20 through an aperture in the frame, and valve 30 incorporated in conduit 101; and a subsystem to remove liquid, which may include sump 50, pump 70 and an outlet 80. As indicated, pump 70 is driven by apparatus, such as motor 75. Valve 88 is a standard valve that may be actuated to direct the flow of liquid to spray arm 40 or, alternatively, outlet 80.

Device 10 for monitoring load, such as machine load, is shown in FIG. 11 as receiving one or more signals from motor 75 and providing one or more signals to controller 201. As described in co-pending application Ser. No. 07/877, 304, controller 201 may receive a number of input signals, such as from device 10, and provide a number of signals to machine 11 to provide closed loop feedback control, such as a signal for controlling valve 30 to open and close conduit 101. Device 10 includes a sensor (not shown) for detecting the power consumption surges of motor 75 as frame 20 receives liquid though conduit 101. Motor 75 consumes power to distribute or circulate liquid in frame 20. For the embodiment of a fluid-handling machine illustrated in FIG. 11, machine load refers to the power consumed by the driving apparatus in the machine, such as motor 75. Likewise, power consumption surges refers to substantial changes in power consumption when load, such as machine load, is changing. For the embodiment of a fluid-handling machine illustrated in FIG. 11, liquid load refers to the amount of liquid being circulated or distributed in machine 11 during a wash cycle. Liquid load is defined relative to a sufficient amount of liquid for a particular wash cycle;

however, in a given situation the liquid load may exceed this sufficient amount or it may be less than this sufficient amount. For the embodiment of a fluid-handling machine illustrated in FIG. 11, motor load refers to the power consumed by motor 75 to distribute or circulate a given liquid load in the machine and is substantially the same load as machine load.

While only certain features of the invention have been illustrated and described herein, many modifications, substitutions, changes and equivalents will now occur to those skilled in the art. For example, a device for measuring phase angle difference in accordance with the present invention may have uses other than detecting power consumption surges. Likewise, a sensor for detecting zero current points in accordance with the present invention may have uses other than in a sensor for detecting power consumption surges. It is, therefore, to be understood that the appended claims are intended to cover all such modifications and changes as fall within the true spirit of the invention.

What is claimed is:

1. A sensor for detecting at least one zero current point of an alternating current in a load, comprising:
   a power source;
   a first rectifier element having a first direction of conduction, said first rectifier element being coupled in series with said load and said power source;
   a second rectifier element having a second direction of conduction said second rectifier element being coupled in series with said load and said power source and in parallel with said firsts rectifier element so that said second direction of conduction opposes said first direction of conduction, said first and second rectifier elements each respectively comprising a diode;
   a third diode, said first and third diodes being coupled in series across said second diode, said third diode having a direction of conduction in the same direction as said first direction of conduction; and
   a voltage sensor coupled in parallel with said first and third diodes and said second diode.

2. The sensor of claim 1, wherein said load comprises an inductive reactance.

3. The sensor of claim 1, wherein said load comprises a motor.

4. The sensor of claim 1, wherein said load comprises a capacitive reactance.

5. The sensor of claim 1, and further comprising a fourth diode, said second and fourth diodes being coupled in series with each other and in parallel with the series combination of said first and third diodes, said fourth diode having a direction of conduction in the same direction as said second direction of conduction.

6. The sensor of claim 1 wherein said voltage sensor comprises an opto-isolator device coupled in series with said load and coupled in parallel with said first and third diodes, said opto-isolator device having the same direction of conduction as said first and third diodes.

7. The sensor of claim 5 wherein said voltage sensor comprises:
   a first opto-isolator device coupled in series with said load and in parallel with said first and third diodes, said opto-isolator device having the same direction of conduction as said first and third diodes; and
   a second opto-isolator device coupled in series with said load and in parallel with said first opto-isolator device, said second opto-isolator device having an opposite direction of conduction from said first opto-isolator device.

8. A method for detecting power consumption surges in an electrical apparatus energized by an alternating current having a plurality of zero current points and an alternating voltage having a plurality of zero voltage points, said method comprising the steps of:
   detecting at least one zero current point of said current with a first rectifier element having a first direction of conduction, said first rectifier element being coupled in series with said apparatus, and a second rectifier element having a second direction of conduction, said second rectifier element being coupled in series with said apparatus and in parallel with said first rectifier element so that said second direction of conduction opposes said first direction of conduction;
   detecting at least the zero voltage point least remote in time from said at least one zero current point; and
   measuring the duration between said at least one zero current point and said least remote zero voltage point.

* * * * *